United States Patent [19]
Park

[11] Patent Number: 5,793,059
[45] Date of Patent: Aug. 11, 1998

[54] STATIC RANDOM ACCESS MEMORY CELL AND METHOD OF FABRICATING THE SAME

[75] Inventor: Joon-Young Park, Seoul, Rep. of Korea

[73] Assignee: LG Semicon Co., Ltd., Chungcheongbuk-do, Rep. of Korea

[21] Appl. No.: 739,018

[22] Filed: Oct. 28, 1996

Related U.S. Application Data

[62] Division of Ser. No. 528,320, Sep. 14, 1995, Pat. No. 5,599,729.

[51] Int. Cl.[6] .......................... H01L 29/76; H01L 31/036; H01L 31/112; G11C 11/36
[52] U.S. Cl. ...................... 257/67; 257/66; 365/188
[58] Field of Search ...................... 257/66, 67, 69, 257/71, 56, 903; 365/188

[56] References Cited

U.S. PATENT DOCUMENTS

| | | | |
|---|---|---|---|
| 5,179,033 | 1/1993 | Adam | 437/41 |
| 5,241,193 | 8/1993 | Pfeister et al. | 257/67 |
| 5,348,903 | 9/1994 | Pfiester et al. | 437/52 |
| 5,440,168 | 8/1995 | Nishimura et al. | 257/56 |
| 5,516,715 | 5/1996 | Itabashi et al. | 437/52 |
| 5,517,038 | 5/1996 | Maeda et al. | 257/69 |

OTHER PUBLICATIONS

International Electron Devices Meeting 1990, San Francisco, CA Dec. 9–12, 1990, Sponsored by Electron Devices Society of IEEE, pp. 18.1.1–18.1.4, no month.

International Electron Devices Meeting 1992, San Francisco, CA Dec. 13–16, 1992, Sponsored by Electron Devices Society of IEEE, pp. 32.7.1–32.7.4.

*Primary Examiner*—Tom Thomas
*Assistant Examiner*—Adriana Giordana

[57] ABSTRACT

A static random access memory cell having a plurality of active regions defined on a semiconductor substrate, includes a plurality of first bulk transistors having a first common gate electrode and first impurity-doped regions, the first common gate electrode and first impurity-doped regions being formed on a portion of the active regions; a plurality of second bulk transistors spaced from the first bulk transistors, the second bulk transistors including a second common gate electrode and second impurity-doped regions, the second common gate electrode and second impurity-doped regions being formed on a portion of the active regions; and a plurality of thin film transistors formed on the second bulk transistors and including the second common gate electrode and a conductive layer formed above the second common gate electrode, wherein the conductive layer overlaps and is substantially coextensive with the second common gate electrode.

18 Claims, 8 Drawing Sheets

FIG.9e
FIG.10e
FIG.9f
FIG.10f
FIG.9g
FIG.10g
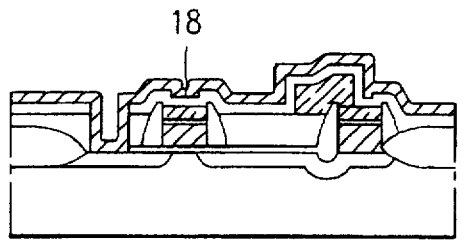
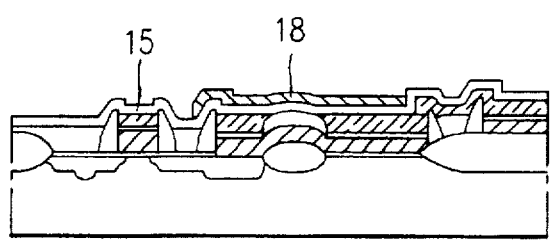
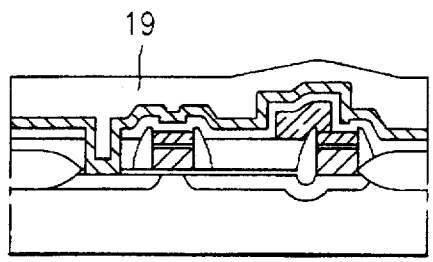
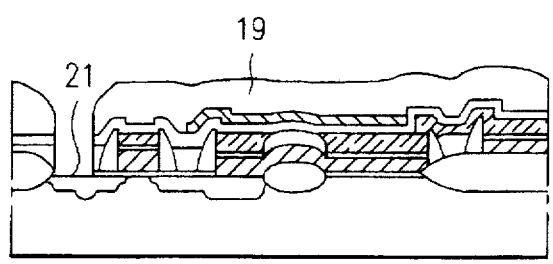
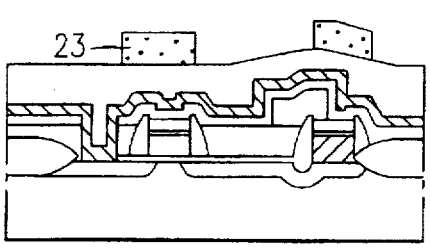
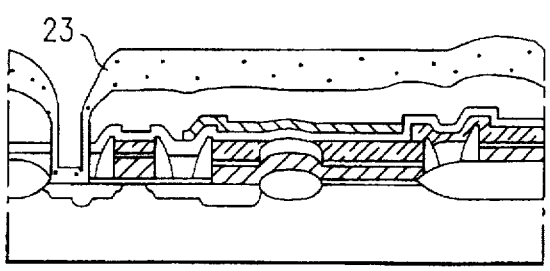

STATIC RANDOM ACCESS MEMORY CELL AND METHOD OF FABRICATING THE SAME

This application is a divisional of application Ser. No. 08/528,320, filed on Sep. 14, 1995, now U.S. Pat. No. 5,559,729, the entire contents of which are hereby incorporated by reference.

BACKGROUND OF THE INVENTION

The present invention relates to a semiconductor memory device and a method of fabricating the same, and more particularly, to a static random access memory (hereinafter referred to as SRAM) cell and method of fabricating the same.

Generally, an SRAM cell consists of either four transistors (for example, two for accessing and two for driving) and two polysilicon load resistors, or six transistors. A high density memory cell of over 4 Mb is made in the form of CMOS transistors, consisting of four NMOS transistors and two PMOS transistors.

FIG. 1 is an equivalent circuit of a conventional CMOS-type SRAM. Referring to this drawing, four NMOS transistors Q1–Q4 are formed on a semiconductor substrate. Two PMOS transistors Q5 and Q6 are formed thereon as thin film transistors (TFTs).

A method of fabricating the conventional SRAM of FIG. 1 will be discussed below with reference to FIGS. 2a–5.

FIG. 2a is a layout of bulk transistors of an SRAM cell in accordance with the conventional art.

FIG. 2b is a layout of TFTs of the SRAM cell in accordance with the conventional art.

FIG. 3 is a layout of an SRAM cell constructed in such a manner that the TFTs of FIG. 2b are formed on the bulk transistors of FIG. 2a.

FIG. 4 is a cross-sectional view of the SRAM cell shown in FIG. 3, taken along the line IV—IV of FIG. 3.

FIG. 5 is a cross-sectional view of the SRAM cell of FIG. 3, taken along the line V—V of FIG. 3.

Referring to FIGS. 2a–5, according to the method of fabricating the conventional SRAM cell, active regions 32 and field regions 32a are defined on a semiconductor substrate 31.

A first gate oxide 33 is formed on the active regions 32. Polysilicon and cap gate nitride 34 are sequentially deposited on the first gate oxide 33. They are patterned and etched through photolithography to define a first gate electrode 35. A sidewall oxide 37 is formed on both sides of the first gate electrode 35.

Subsequently, first and second impurity-doped regions 39 and 41 are formed by ion-implanting polysilicon into the active regions 32. A first interlevel insulating layer 43 is then deposited on the overall surface of the substrate, and selectively etched to expose a predetermined portion thereof. Polysilicon is deposited on the first interlevel insulating layer 43 and contacts the first impurity-doped region 39, to form a Vss line 44.

A second interlevel insulating layer 45 and polysilicon are deposited on the Vss line 44 having a contact 44a. The obtained polysilicon layer is patterned through photolithography, to form a second gate electrode 46 having a contact 46a. A second gate oxide 47 and polysilicon are deposited on the overall surface of the substrate. Using an offset mask 48, impurities are doped into the second gate oxide 47 to form a body 49 of a TFT. The formed TFT comprises source, drain and channel regions. Then, to improve the characteristics of the transistor, heat treatment is carried out. As a result, the grain size of the polysilicon in the body 49 is enlarged. The conventional SRAM cell further includes an insulating layer 50 and a bitline 51 having a contact 51a.

After performing exposure and etch processes, a metallization process is performed to finish forming the SRAM cell. However, the SRAM cell formed by the conventional method involves several problems.

First, when the TFT is formed on the bulk transistor, the process of forming the second gate electrode is carried out independent of that of the first gate electrode. This increases the number of processing steps necessary in forming a TFT.

Second, accurate offset alignment is difficult to achieve because the position of the offset mask of the TFTs varies with the arrangement of the bulk transistor. This deteriorates the characteristics of the TFTs.

Third, the second gate electrode and body of the TFTs are formed on the bulk transistor, resulting in poor step coverage. As a result, it becomes difficult to perform the metallization process.

SUMMARY OF THE INVENTION

It is an object of the present invention to provide an SRAM cell and method of fabricating the same, in which a common gate electrode is used both for a bulk transistor and for a TFT, reducing the number of processing steps involved.

Another object of the present invention is to provide an SRAM cell and method of fabricating the same, in which offset alignment is accurately performed to improve characteristics of the TFT.

Yet another object of the present invention is to provide an SRAM cell and method of fabricating the same, which enhances step coverage and simplifies the metallization process.

To accomplish the above objects of the present invention, there is provided a static random access memory cell, comprising: a semiconductor substrate; a plurality of active regions defined on the substrate; two first bulk transistors having a common gate electrode and two impurity-doped regions, the gate electrode and impurity-doped regions being formed on the active regions; two second bulk transistors spaced from the two first bulk transistors, the bulk transistors including another common gate electrode and two impurity-doped regions, the gate electrode and impurity-doped regions being formed on the active regions; and two thin film transistors formed on the two second bulk transistors, the thin film transistors using the common gate electrode as their gate electrode, the thin film transistors including a conductive layer formed on the common gate electrode, to thereby form bodies of the respective thin film transistors.

For the objects of the present invention, there is further provided a method of fabricating an SRAM cell, comprising the steps of: preparing a semiconductor substrate; forming a plurality of active regions and field regions on the substrate; forming a common gate electrode and two impurity-doped regions on the active regions to thereby form two first bulk transistors, and simultaneously forming a common gate electrode and two impurity-doped regions on the active regions separated from the first bulk transistors by a predetermined distance to thereby form two second bulk transistors; forming a gate oxide layer on the overall surface of the substrate; forming a conductive layer to form a thin film transistor body on the gate oxide layer; and etching back the conductive layer so that the conductive layer remains only on a common gate electrode of the respective first and second bulk transistors, Vcc connectors overlapping the common gate electrodes by a predetermined width, and transistor connectors overlapping with a common gate electrode of the second bulk transistor by a predetermined width, thereby forming two thin film transistors.

3

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a layout of an SRAM cell constructed in such a manner that the TFTs of FIG. 2b are formed on the bulk transistors of FIG. 2a;

FIGS. 9a–9g are cross-sectional views of the SRAM cell, taken along the line VII—VII of FIG. 6, showing the sequence of a manufacturing process according to an embodiment of the present invention; and FIGS. 10a–10g are cross-sectional views of the SRAM cell, taken along the line VIII—VIII of FIG. 6, showing the sequence of the manufacturing process.

DETAILED DESCRIPTION OF THE PREFERRED EMBODIMENTS

A preferred embodiment of the present invention will be explained below with reference to the accompanying drawings.

Figure 1:
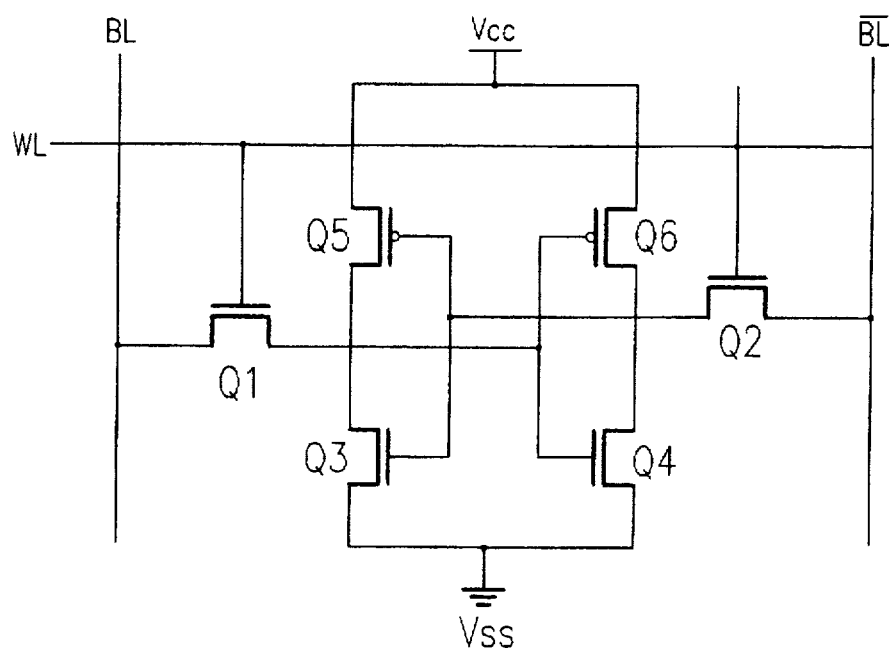
FIG. 1 is an equivalent circuit of a conventional SRAM cell.
Figure 2A:
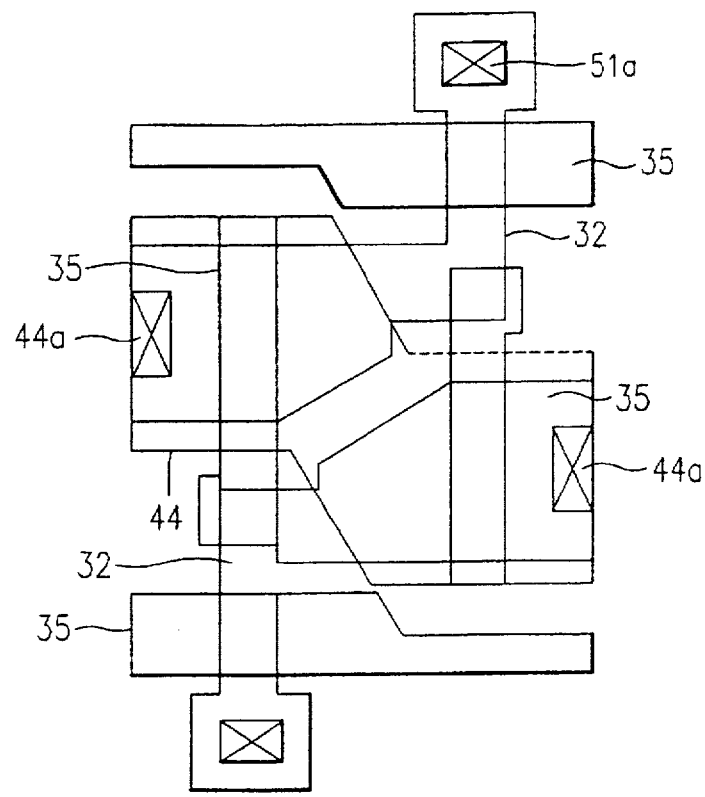
FIG. 2a is a layout of bulk transistors of an SRAM cell in accordance with the conventional art.
Figure 2B:
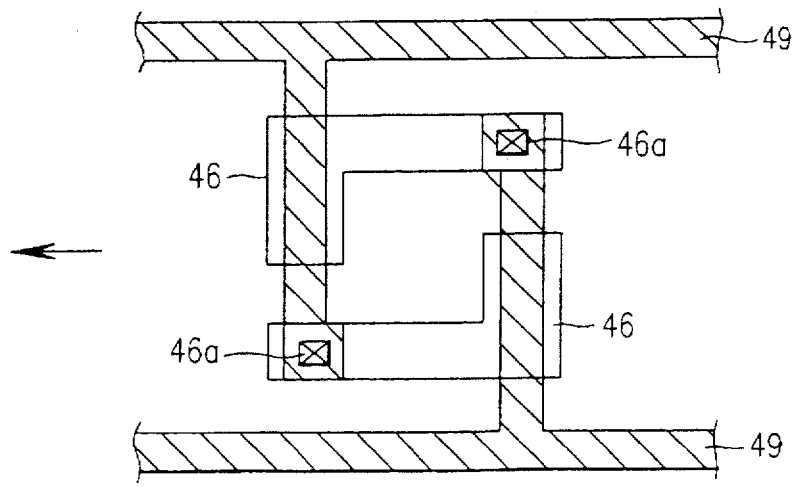
FIG. 2b is a layout of TFTs of an SRAM cell in accordance with the conventional art.
Figure 3:
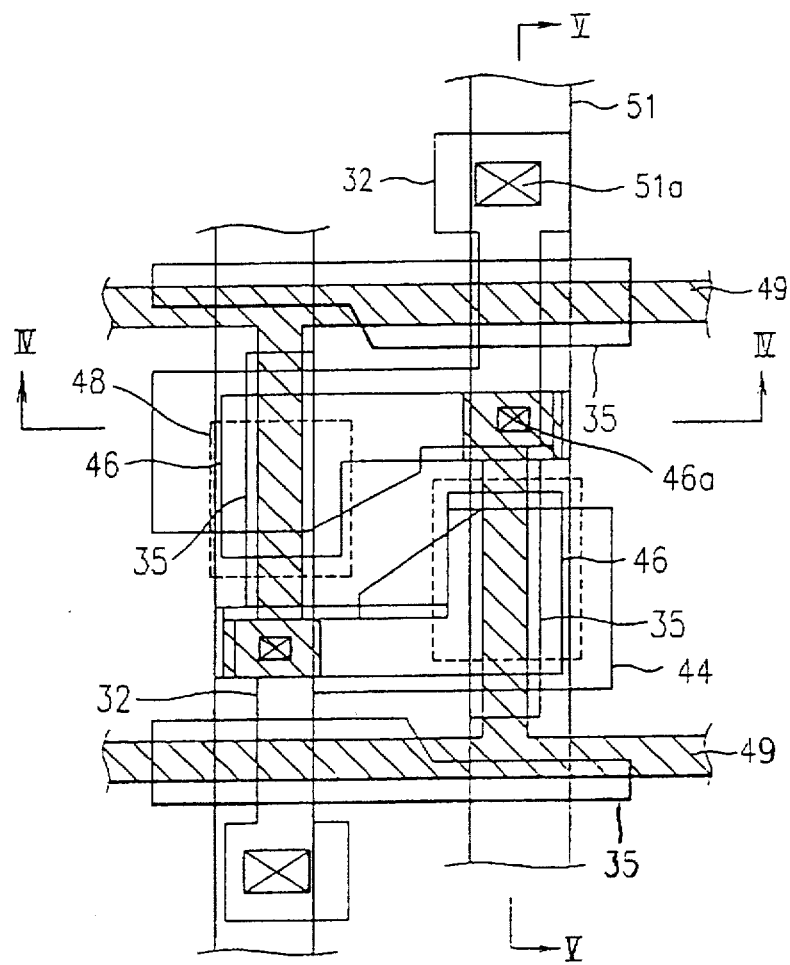
Figure 4:
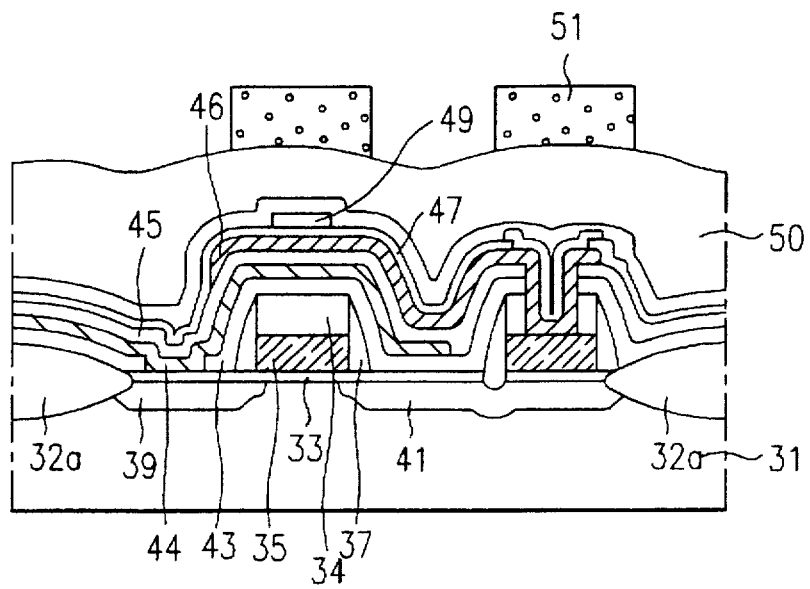
FIG. 4 is a cross-sectional view of the SRAM cell shown in FIG. 3, taken along the line IV—IV of FIG. 3.
Figure 5:
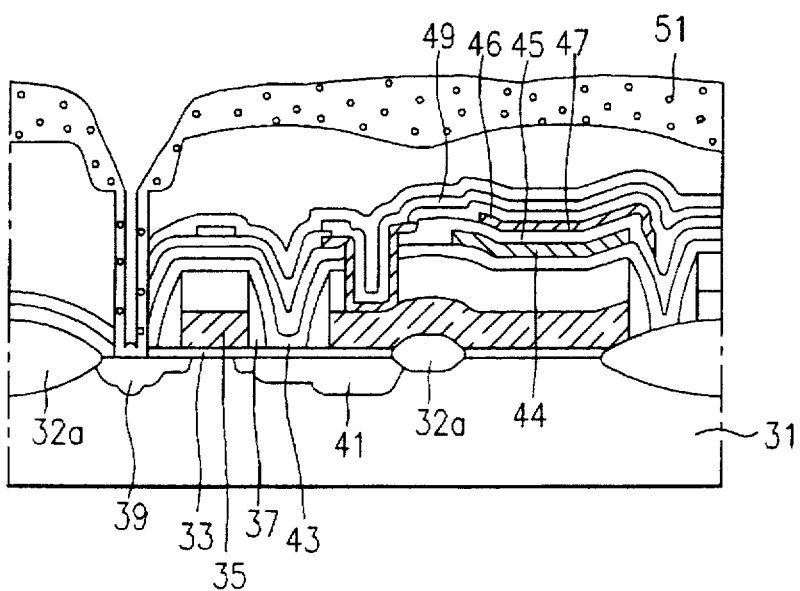
FIG. 5 is a cross-sectional view of the SRAM cell of FIG. 3, taken along the line V—V of FIG. 3.
Figure 6:
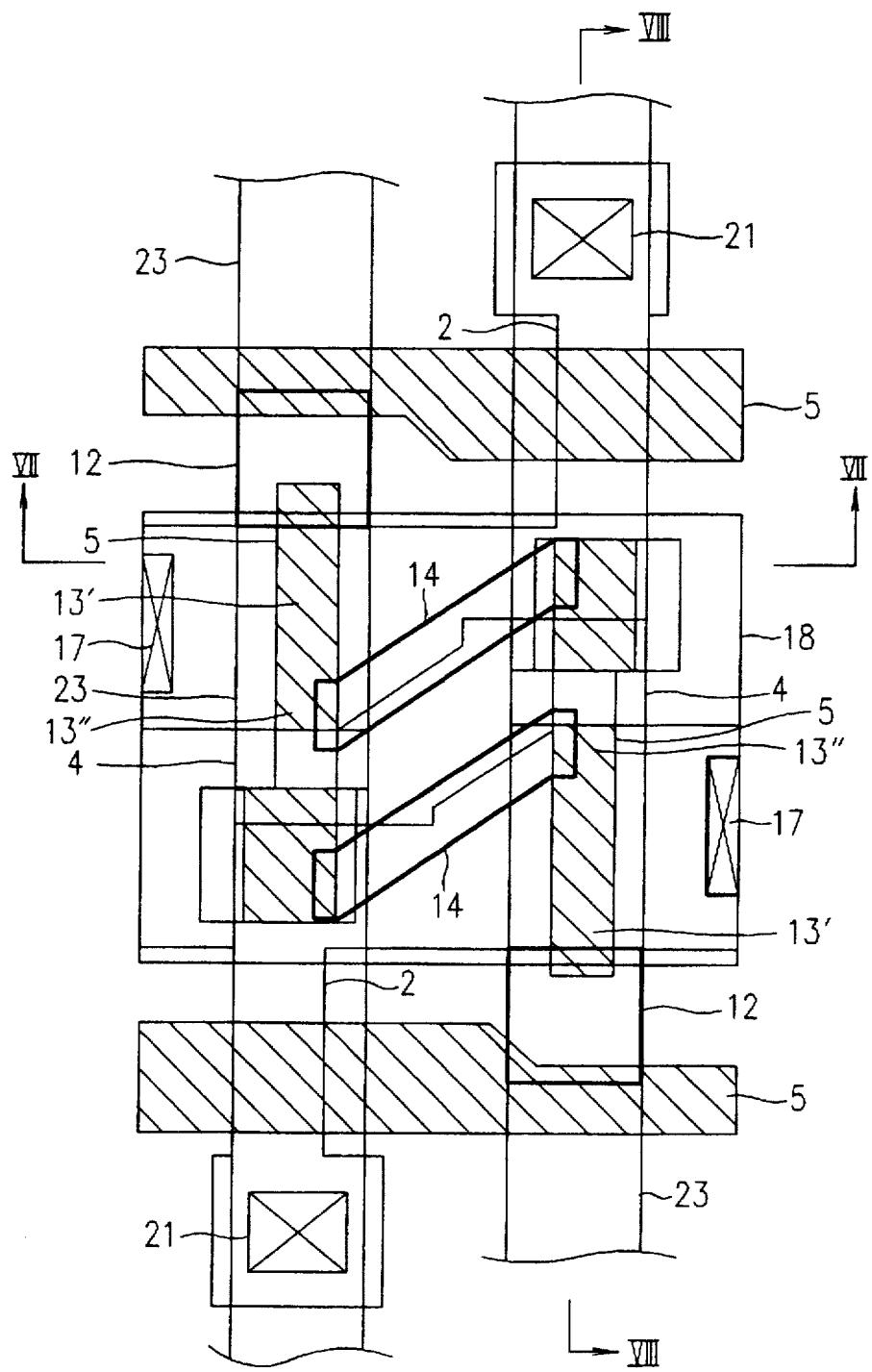
FIG. 6 is an exemplary layout of an SRAM cell in accordance with an embodiment of the present invention.
Figure 7:
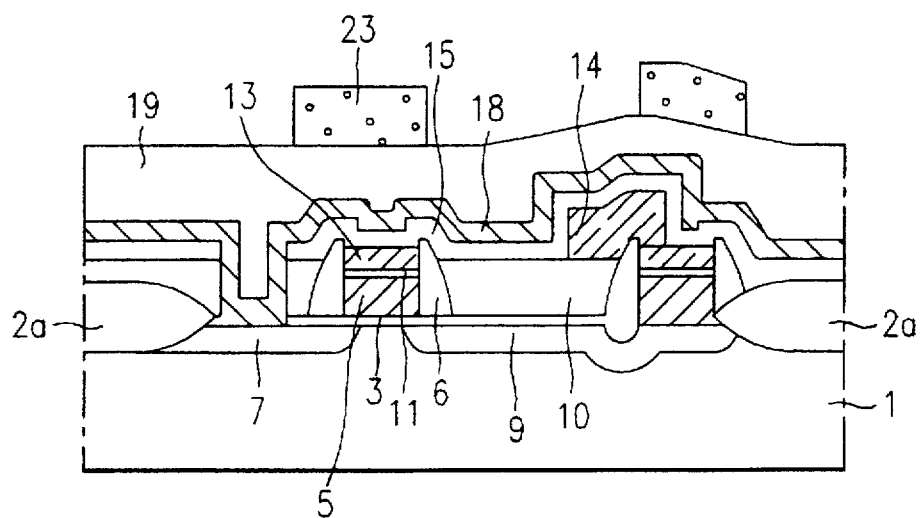
FIG. 7 is a cross-sectional view of the SRAM cell shown in FIG. 6, taken along the line VII—VII of FIG. 6.
Figure 8:
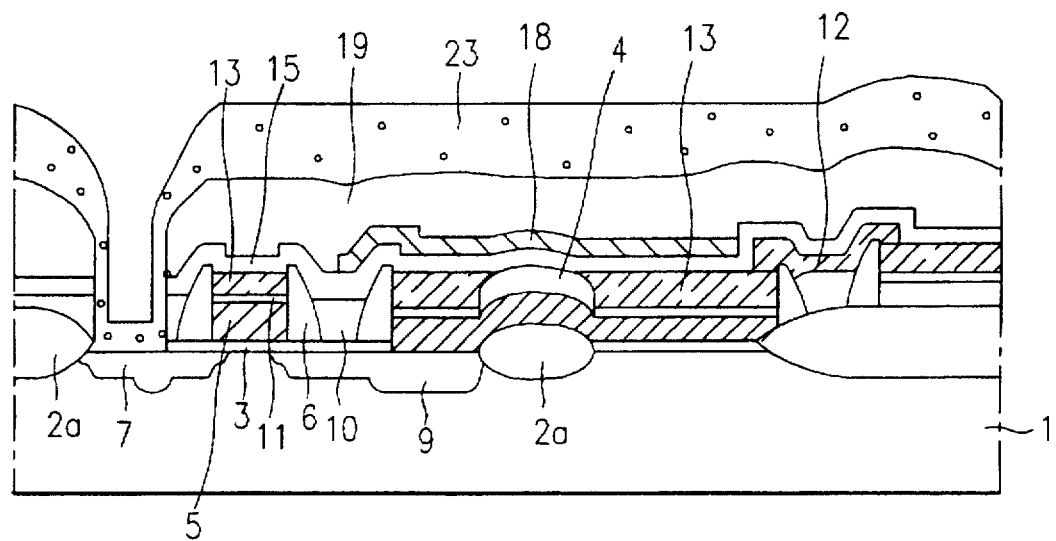
FIG. 8 is a cross-sectional view of the SRAM cell shown in FIG. 6, taken along the line VIII—VIII of FIG. 6.

Referring to FIGS. 6–8, an SRAM cell of the present invention comprises two first bulk transistors and two second bulk transistors formed on a semiconductor substrate 1, and two TFTs formed over the two second bulk transistors.

The first and second bulk transistors each comprise a first gate oxide 3 formed on active regions 2 defined on the substrate 1, a common gate electrode 5 formed on the first gate oxide 3, and first and second impurity-doped regions 7 and 9 formed on the surface of the substrate 1 as source and drain regions.

A sidewall oxide layer 6 is formed on the sides of the common gate electrode 5. A first BPSG layer 10 is formed in a valley between the sidewall oxide layer 6. The two TFTs each employ the common gate electrode of the second bulk transistor as their gate electrode, and are composed of a second gate oxide layer 11 formed on the common gate electrode 5 and a conductive layer 13 formed on the second gate oxide layer 11. The conductive layer 13 is used as source, drain and channel regions and connected to a Vcc pad 12 which overlaps a predetermined width of the first and second bulk transistors. As shown in FIG. 6, the conductive layer 13 includes a source region 13', a drain region 13" and a channel region therebetween. The conductive layer 13 overlaps and is substantially coextensive with the corresponding common gate electrode 5. The conductive layer 13 is also connected to a transistor connector 14 superposed on the second bulk transistors by a predetermined width.

An interlevel insulating layer 15 is formed on the conductive layer 13. A Vss line 18 is formed on the interlevel insulating layer 15 and connected to the first impurity-doped region of the second bulk transistors. A second BPSG layer 19 is formed on the Vss line 18.

A bitline 23 is formed on the second BPSG layer 19 and connected to the first impurity-doped region of the first bulk transistors. A method of fabricating the SRAM cell of the present invention will be explained below with reference to the accompanying drawings.

Figure 9A:
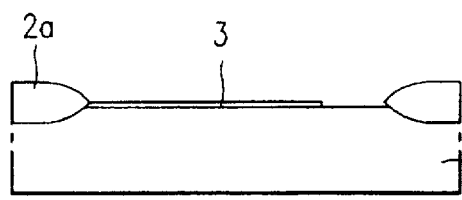
Figure 10A:
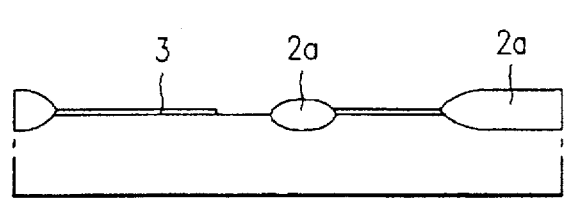

First, as shown in FIGS. 9a and 10a, a semiconductor substrate 1 is prepared, and active regions 2 and field regions 2a are defined on the surface of the substrate 1 by LOCOS process. A first gate oxide 3 is then formed on the active regions 2 and is selectively etched to form a contact.

Figure 9B:
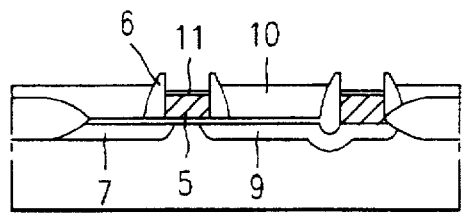
Figure 10B:
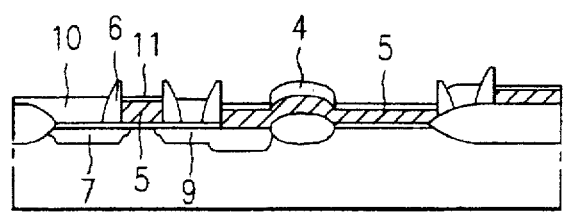

Next, as shown in FIGS. 9b and 10b, polysilicon is deposited on the first gate oxide 3 to a predetermined thickness, and a cap gate nitride layer 4 is deposited thereon. The stack of the cap gate nitride and polysilicon layers is patterned and etched, to form a common gate electrode 5.

Subsequently, oxide is deposited on the overall surface of the substrate, and etched by anisotropic etching process, to form a sidewall oxide layer 6 on the sides of the common gate electrode 5. Then, first and second impurity-doped regions 7 and 9, as source and drain regions, are formed by ion-doping n+ impurity ions into the active regions 2, to complete the formation of the first and second bulk transistors on the substrate 1.

A first BPSG layer 10 is formed by depositing materials such as BPSG and PSG onto the valley formed between the sidewall oxide layers 6, to thereby planarize the surface of the substrate.

Figure 9C:
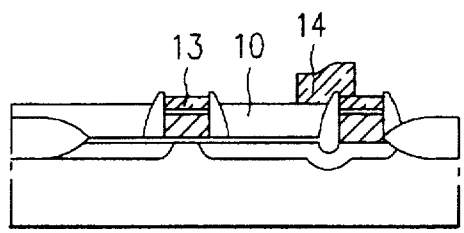
Figure 10C:
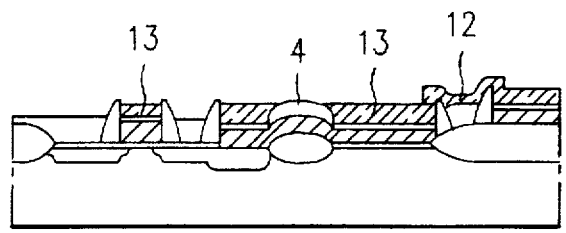

As shown in FIGS. 9c and 10c, the first BPSG layer 10 is etched back in order to expose a cap nitride layer 4 formed on the common gate electrode 5. Using a wet etch process, portions of the cap nitride layer 4 are selectively removed and the remaining cap nitride layer 4, left on a predetermined portion of the common gate electrode of the respective second bulk transistors, makes contact with the end of a PMOS transistor.

Then, a second gate oxide layer 11 of the TFTs is formed by oxidizing the exposed surface of the first and second bulk transistors. Polysilicon is deposited on the overall surface of the substrate to a predetermined thickness.

A conductive layer 13 as channel, source and drain regions is formed by etching back the polysilicon layer. The conductive layer 13 is formed only on the first and second bulk transistor, a Vcc pad 12 and a transistor connector 14. The Vss pad 12 is formed to contact the conductive layer 13, while the mask pattern of the Vcc pad 12 overlaps the first and second bulk transistors by a predetermined width. The transistor connector 14 is formed to contact the conductive layer 13, while the mask pattern of the transistor connector 14 overlaps the second bulk transistors by a predetermined width.

Figure 9D:
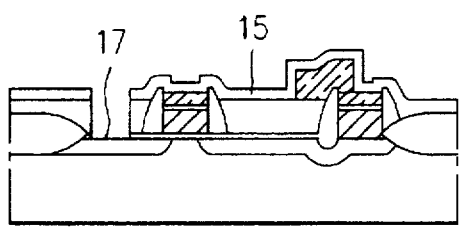
Figure 10D:
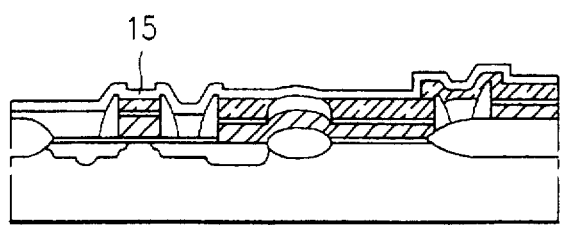

As shown in FIGS. 9d and 10d, an interlevel insulating layer 15 is deposited on the overall surface of the substrate, and selectively etched to expose the first impurity-doped region 7 of the second bulk transistors. As a result, a first contact hole 17 is formed.

Then, as shown in FIGS. 9e and 10e, polysilicon is deposited on the interlevel insulating layer 15, making contact with the first impurity-doped region 7 through the first contact hole 17. The formed polysilicon layer is etched back to create a Vss line 18.

As shown in FIGS. 9f and 10f, a second BPSG layer 19 is formed by depositing BPSG on the overall surface of the substrate. The BPSG layer is etched back to expose the first impurity-doped region 7 of the first bulk transistors and to form a second contact hole 21 for metal contact.

Subsequently, as shown in FIGS. 9g and 10g, bitline 23 is formed by depositing a metal material (for example, Al) on the second BPSG layer 19. The bitline 23 contacts the first impurity-doped region 7 through the second contact hole 21, to thereby complete the manufacturing process of the SRAM cell according to the embodiment of the present invention.

In the memory cell formed by the aforementioned processes of the present invention, a common gate electrode is used as the gate electrodes of the TFTs and bulk transistors. The step of forming the gate electrode of the TFTs is eliminated, which decreases the number of processing steps involved in manufacturing the memory cell.

According to the present invention, alignment of offset is determined according to the arrangement of the common gate electrode of the bulk transistor. By doing so, the alignment of offset can be performed easily and more accurately.

Accordingly, characteristics of the TFTs become uniform, which results in more stable characteristics of the SRAM. Furthermore, the step coverage of the cell is enhanced because a common gate electrode is used in the second bulk transistors and in the TFTs. As a result, the metallization process is facilitated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A static random access memory cell including a plurality of active regions defined on a semiconductor substrate, comprising:
    a plurality of first bulk transistors having a first common gate electrode and first impurity-doped regions, said first common gate electrode and first impurity-doped regions being formed on a portion of the active regions;
    a plurality of second bulk transistors spaced from said first bulk transistors, said second bulk transistors including a second common gate electrode and second impurity-doped regions, said second common gate electrode and second impurity-doped regions being formed on a portion of the active regions; and
    a plurality of thin film transistors formed on said second bulk transistors and including said second common gate electrode and a conductive layer formed above said second common gate electrode,
    wherein said conductive layer overlaps and is substantially coextensive with said second common gate electrode.

2. The static random access memory cell as claimed in claim 1, wherein said conductive layer includes source, drain and channel regions of said thin film transistors.

3. The static random access memory cell as claimed in claim 1, further comprising:
    a potential pad which overlaps portions of said first and second bulk transistors.

4. The static random access memory cell as claimed in claim 3, wherein a portion of said conductive layer formed on said second bulk transistors is overlapped by said potential pad.

5. The static random access memory cell as claimed in claim 3, further comprising:
    a transistor connector which overlaps a portion of said second bulk transistors.

6. The static random access memory cell as claimed in claim 5, wherein a portion of said conductive layer formed on said second bulk transistors, excluding portions of said conductive layer overlapping said potential pad and said transistor connector, serves as a channel region of said thin film, transistors.

7. The static random access memory cell as claimed in claim 5, further comprising:
    a cap nitride layer formed on a portion of said second common gate electrode of said second bulk transistors.

8. Th estatic random access memory cell as claimed ni claim 7, wherein said cap nitride layer contacts said transistor connector.

9. The static random access memory cell as claimed in claim 7, wherein said cap nitride layer insulates said thin film transistors from each other.

10. The static random access memory cell, as claimed in claim 1, further comprising:
    sidewall spacers formed on sides of said second common gate electrode of said second bulk transistors, wherein the height of said sidewall spacers is greater than that of said second common gate electrode.

11. The static random access memory cell, as claimed in claim 10, wherein said conductive layer is formed above said second common gate electrode and between the sidewall spacers.

12. The static random access memory cell, as claimed in claim 11, wherein said conductive layer includes source, drain and channel regions of said thin film transistors.

13. The static random access memory cell, as claimed in claim 1, wherein source, drain and channel regions of said second bulk transistors extend substantially perpendicular to source, drain and channel regions of said thin film transistors.

14. The static random access memory cell, as claimed in claim 13, wherein said source, drain and channel regions of said thin film transistors are formed in said conductive layer formed above said second common gate electrode.

15. The static random access memory cell, as claimed in claim 1, wherein a size of said conductive layer substantially corresponds to a size of said second common gate electrode.

16. The static random access memory cell, as claimed in claim 15, wherein said conductive layer includes source, drain and channel regions of said thin film transistors.

17. The static random access memory cell, as claimed in claim 1, wherein a shape of said conductive layer substantially corresponds to a shape of said second common gate electrode.

18. The static random access memory cell, as claimed in claim 17, wherein said conductive layer includes source, drain and channel regions of said thin film transistors.

* * * * *